United States Patent
Wei et al.

(10) Patent No.: US 9,099,307 B2
(45) Date of Patent: Aug. 4, 2015

(54) METHOD FOR MAKING EPITAXIAL STRUCTURE

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 257 days.

(21) Appl. No.: 13/713,571

(22) Filed: Dec. 13, 2012

(65) Prior Publication Data
US 2013/0288464 A1   Oct. 31, 2013

(30) Foreign Application Priority Data
Apr. 25, 2012 (CN) .......................... 2012 1 0122583

(51) Int. Cl.
*H01L 21/02*   (2006.01)

(52) U.S. Cl.
CPC ...... *H01L 21/02518* (2013.01); *H01L 21/0237* (2013.01); *H01L 21/02439* (2013.01); *H01L 21/02444* (2013.01); *H01L 21/02494* (2013.01); *H01L 21/02499* (2013.01); *H01L 21/02502* (2013.01); *H01L 21/02513* (2013.01); *H01L 21/02521* (2013.01)

(58) Field of Classification Search
None
See application file for complete search history.

(56) References Cited

U.S. PATENT DOCUMENTS

| 2006/0267029 | A1* | 11/2006 | Li ................................... 257/79 |
| 2010/0323164 | A1* | 12/2010 | Ogihara et al. ............... 428/156 |
| 2013/0032777 | A1* | 2/2013 | Yin et al. .......................... 257/9 |
| 2013/0285013 | A1* | 10/2013 | An et al. ......................... 257/13 |

FOREIGN PATENT DOCUMENTS

| WO | WO 2012057512 A2 * | 5/2012 |
| WO | WO 2012126155 A1 * | 9/2012 |

* cited by examiner

*Primary Examiner* — Evan Pert
*Assistant Examiner* — Shaka White
(74) *Attorney, Agent, or Firm* — Novak Druce Connolly Bove + Quigg LLP

(57) ABSTRACT

A method for making an epitaxial structure includes following steps. A substrate having an epitaxial growth surface is provided. A first epitaxial layer is epitaxially grown on the epitaxial growth surface. A graphene layer is applied on the first epitaxial layer. A second epitaxial layer is epitaxially grown on the first epitaxial layer.

12 Claims, 14 Drawing Sheets

METHOD FOR MAKING EPITAXIAL STRUCTURE

CROSS-REFERENCE TO RELATED APPLICATIONS

This application claims all benefits accruing under 35 U.S.C. §119 from China Patent Application: Application No. 201210122583.6, filed on Apr. 25, 2012 in the China Intellectual Property Office, disclosure of which are incorporated herein by reference.

BACKGROUND

1. Technical Field

The present disclosure relates to an epitaxial structure and a method for making the same.

2. Description of Related Art

Light emitting devices such as light emitting diodes (LEDs) using group III-V nitride semiconductors, such as gallium nitride (GaN), have been put into practice.

Since wide GaN substrate cannot be produced, the LEDs have been produced upon a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads in turn to cracking and difficulty in fabricating devices with small feature sizes. A method for solving the problem is forming a plurality of grooves on surface of the sapphire substrate by lithography or etching. However, the process of lithography and etching are complex, high cost, and may pollute the sapphire substrate.

What is needed, therefore, is to provide an epitaxial method for solving the problem discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
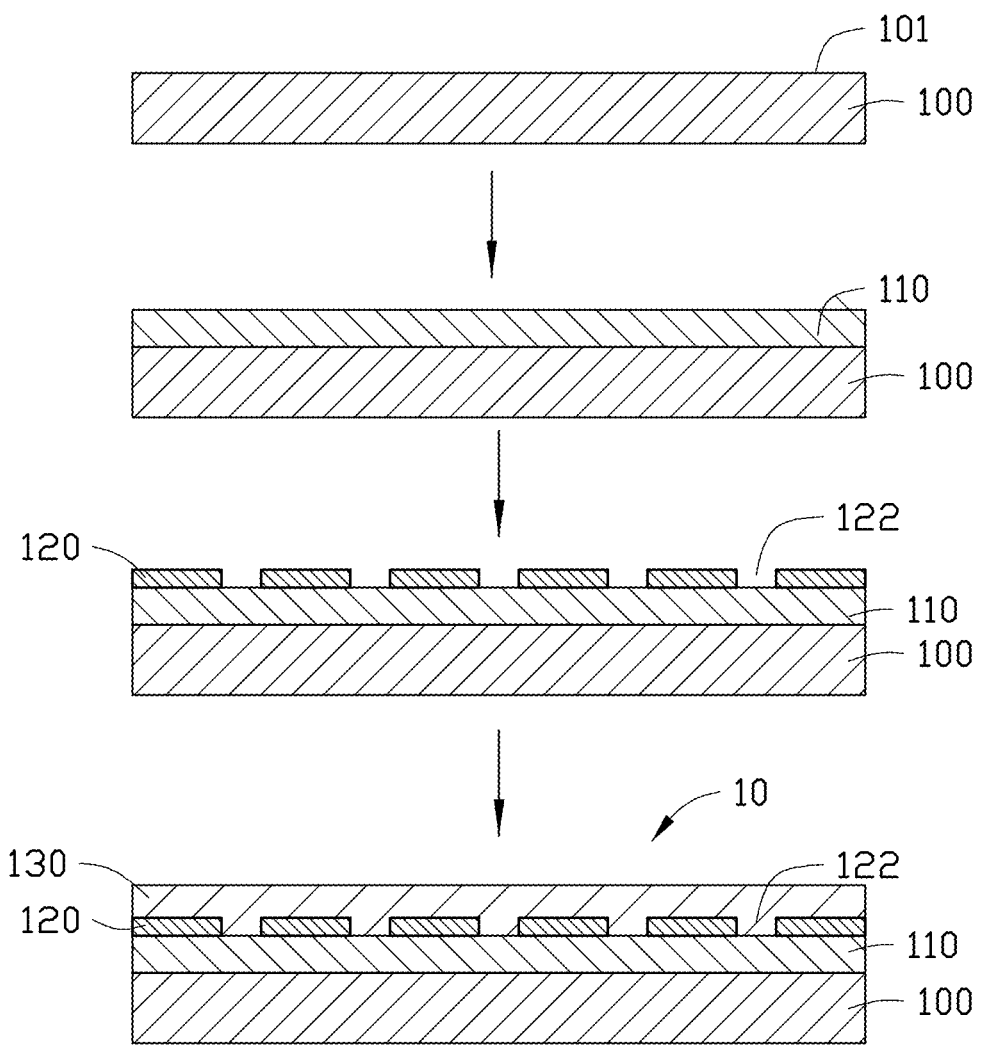
FIG. 1 is a flowchart of one embodiment of a method for making an epitaxial structure.

Referring to FIG. 1, a method for making an epitaxial structure 10 of one embodiment includes following steps:

(S11) providing a substrate 100 having an epitaxial growth surface 101;

(S12) epitaxially growing a first epitaxial layer 110 on the epitaxial growth surface 101;

(S13) placing a graphene layer 120 on the first epitaxial layer 110; and (S14) epitaxially growing a second epitaxial layer 130 on the epitaxial growth surface 101.

In step (S11), the epitaxial growth surface 101 is used to grow the first epitaxial layer 110. The epitaxial growth surface 101 is a clean and smooth surface. Oxygen and carbon are removed from the surface. The substrate 100 can be a single layer structure or a multiple layer structure. If the substrate 100 is a single layer structure, the substrate 100 can be a single-crystal structure. The single-crystal structure includes a crystal face which is used as the epitaxial growth surface 101. The material of the substrate 100 can be SOI (Silicon on insulator), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The material of the substrate 100 is not limited, as long as the substrate 100 has an epitaxial growth surface 101 on which the first epitaxial layer 110 can grow. If the substrate 100 is a multiple layer structure, the substrate 100 should include at least one layer of the single-crystal structure mentioned previously. The material of the substrate 100 can be selected according to the first epitaxial layer 110. In one embodiment, the lattice constant and thermal expansion coefficient of the substrate 100 is similar to the first epitaxial layer 110 thereof in order to improve the quality of the first epitaxial layer 110. In another embodiment, the material of the substrate 100 is sapphire. The thickness and the shape of the substrate 100 are arbitrary and can be selected according to need.

In step (S12), the first epitaxial layer 110 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The first epitaxial layer 110 is a single crystal layer grown on the patterned epitaxial growth surface by epitaxy growth method. The material of the first epitaxial layer 110 can be the same as or different from the material of the substrate 100. If the first epitaxial layer 110 and the substrate 100 are the same material, the first epitaxial layer 110 is called a homogeneous epitaxial layer. If the first epitaxial layer 110 and the substrate 100 have different material, the first epitaxial layer 110 is called a heteroepitaxial epitaxial layer. The material of the first epitaxial layer 110 can be semiconductor, metal or alloy. The semiconductor can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the first epitaxial layer 110 can be prepared according to need. The thickness of the first epitaxial layer 110 can be in a range from about 100 nanometers to about 500 micrometers. For example, the thickness of the first epitaxial layer 110 can be about 200 nanometers, 500 nanometers, 1 micrometer, 2 micrometers, 5 micrometers, 10 micrometers, or 50 micrometers.

The step (S12) includes the following substeps:
- (S121) placing the substrate 100 with the graphene layer 120 thereon into a reaction chamber and heating the substrate 100 to 1100° C.~1200° C., introducing the carrier gas and baking the substrate 100 for about 200 seconds to about 1000 seconds;
- (S122) cooling down the temperature to a range from about 500° C. to 650° C. in the carrier gas atmosphere, introducing the Ga source gas and the nitrogen source gas at the same time to grow the low-temperature GaN layer;
- (S123) stopping introducing the Ga source gas in the carrier gas and nitrogen source gas atmosphere, increasing the temperature to a range from about 1100° C. to about 1200° C. and keeping for about 30 seconds to about 300 seconds;
- (S124) keeping the temperature of the substrate 100 in a range from about 1000° C. to about 1100° C., introducing the Ga source gas again and the Si source gas to grow the high quality first epitaixal layer 110.

Furthermore, a step of growing an intrinsic epitaxial layer between step (S122) and step (S123). The intrinsic epitaxial layer can further reduce the dislocation during growing the first epitaxial layer 110.

In step (S13), the graphene layer 120 is directly in contact with the substrate 100. The graphene layer 120 can include at least one graphene film. The graphene film, namely a single-layer graphene, is a single layer of continuous carbon atoms. The single-layer graphene is a nanometer-thick two-dimensional analog of fullerenes and carbon nanotubes. When the graphene layer 120 includes the at least one graphene film, a plurality of graphene films can be stacked on each other or arranged coplanar side by side. The graphene film can be patterned by cutting or etching. The thickness of the graphene layer 120 can be in a range from about 1 nanometer to about 100 micrometers. For example, the thickness of the graphene layer 120 can be 1 nanometer, 10 nanometers, 200 nanometers, 1 micrometer, or 10 micrometers. The single-layer graphene can have a thickness of a single carbon atom. In one embodiment, the graphene layer 120 is a pure graphene structure consisting of graphene.

The single-layer graphene has very unique properties. The single-layer graphene is almost completely transparent. The single-layer graphene absorbs only about 2.3% of visible light and allows most of the infrared light to pass through. The thickness of the single-layer graphene is only about 0.34 nanometers. A theoretical specific surface area of the single-layer graphene is 2630 $m^2 \cdot g^{-1}$. The tensile strength of the single-layer graphene is 125 GPa, and the Young's modulus of the single-layer graphene can be as high as 1.0 TPa. The thermal conductivity of the single-layer graphene is measured at 5300 $W \cdot m^{-1} \cdot K^{-1}$. A theoretical carrier mobility of the single-layer graphene is $2 \times 10^5$ $cm^2 \cdot V^{-1} \cdot s^{-1}$. A resistivity of the single-layer graphene is $1 \times 10^{-6} \Omega \cdot cm$ which is about ⅔ of a resistivity of copper. Phenomenon of quantum Hall effects and scattering-free transmissions can be observed on the single-layer graphene at room temperature.

Figure 2:
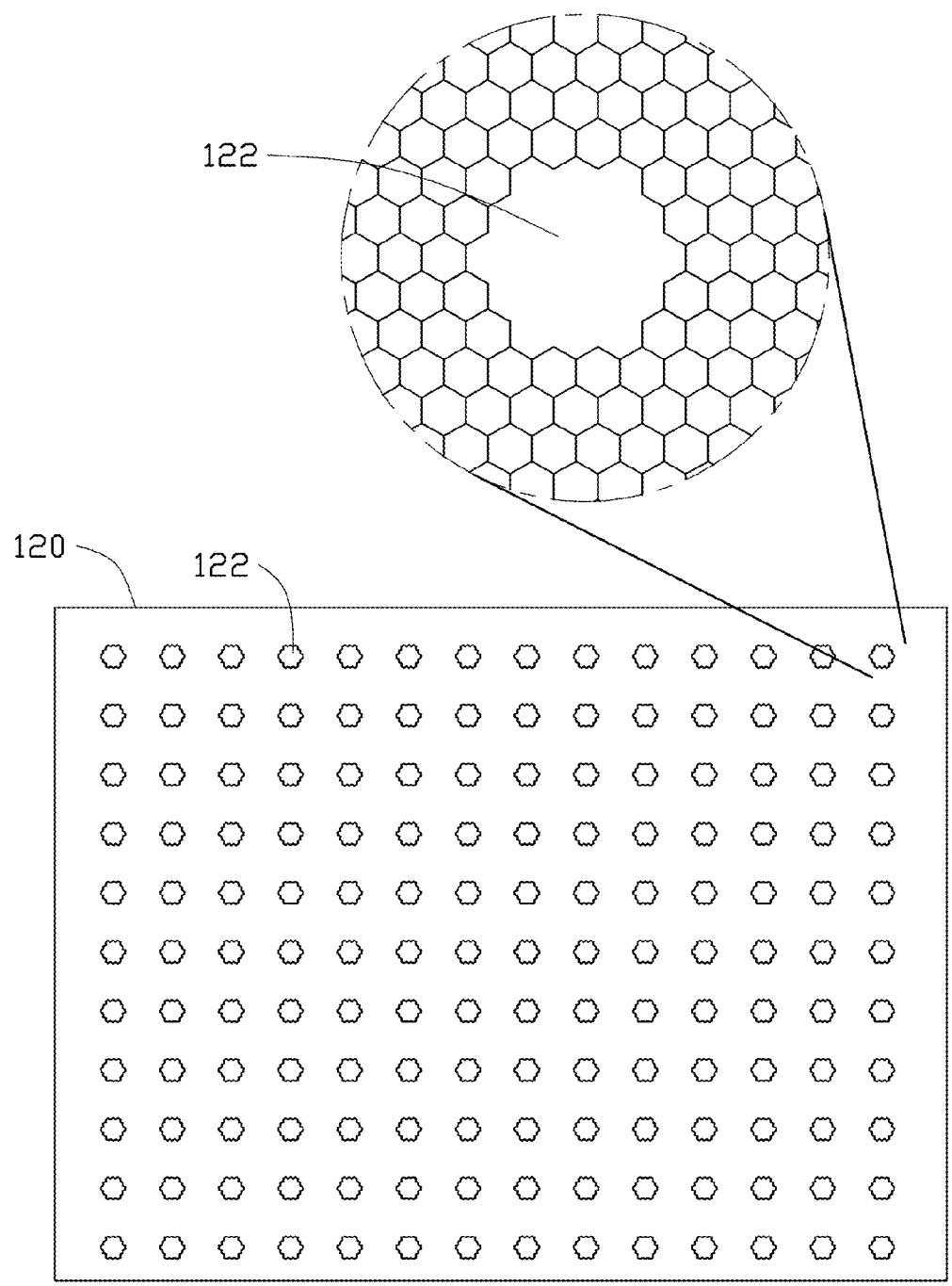
FIG. 2 is a schematic view of one embodiment of a graphene layer having a plurality of circular shaped apertures.
Figure 3:
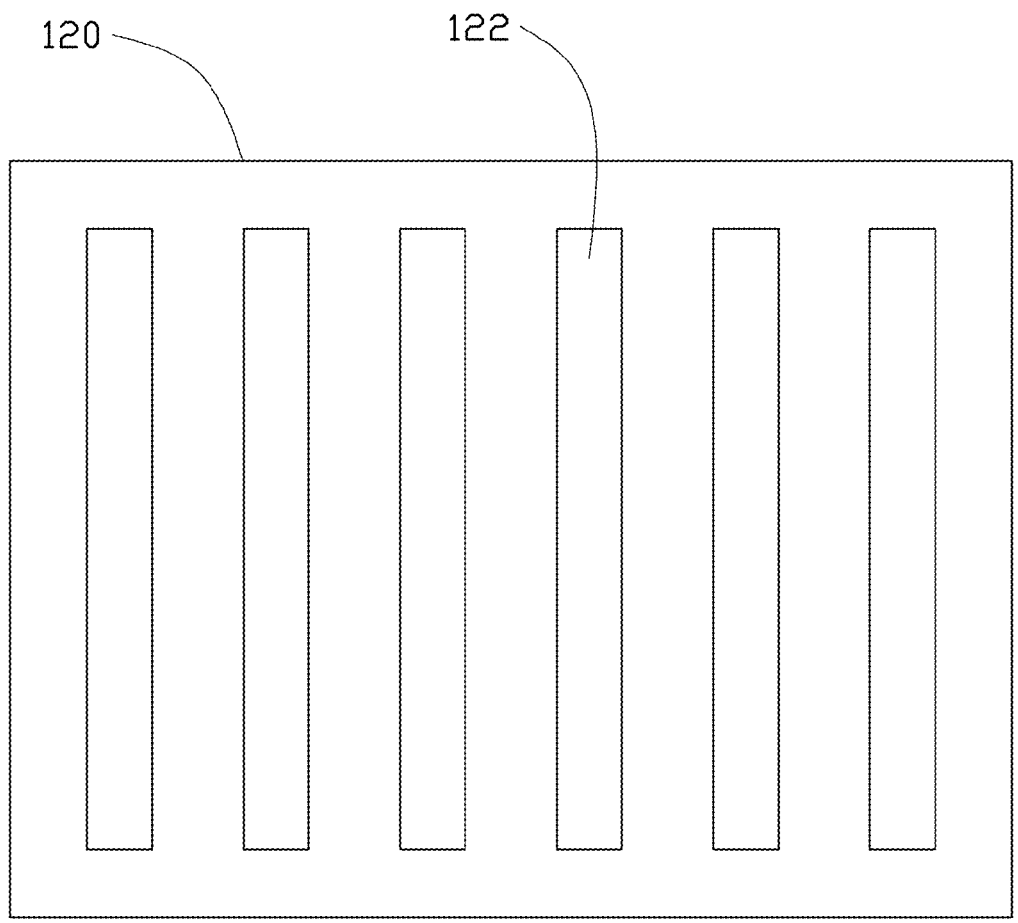
FIG. 3 is a schematic view of one embodiment of a graphene layer having a plurality of rectangular shaped apertures.
Figure 4:
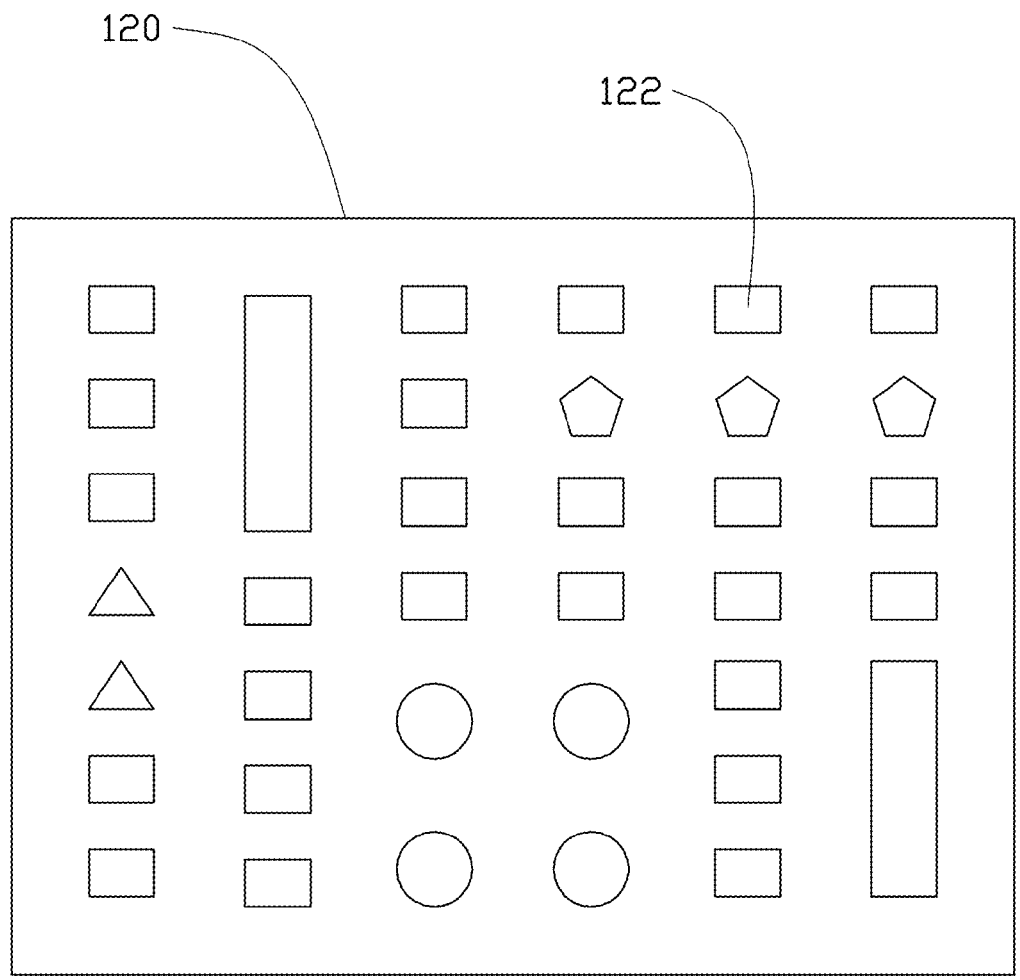
FIG. 4 is a schematic view of one embodiment of a graphene layer having apertures in different shapes.

In one embodiment, the graphene layer 120 is a patterned structure. As shown in FIGS. 2-4, the term "patterned structure" means the graphene layer 120 is a continuous structure and defines a plurality of apertures 122. When the graphene layer 120 is located on the epitaxial growth surface 101, part of the epitaxial growth surface 101 is exposed from the apertures 122 to grow the first epitaxial layer 110.

The shape of the aperture 122 is not limited and can be round, square, triangular, diamond or rectangular. The graphene layer 120 can have the apertures 122 of all the same shape or of different shapes. The apertures 122 can be dispersed uniformly on the graphene layer 102. Each of the apertures 122 extends through the graphene layer 120 along the thickness direction. The apertures 122 can be circular shaped as shown in FIG. 2 or rectangular shaped as shown in FIG. 2. Alternatively, the apertures 122 can be a mixture of circular shaped and rectangular shaped in the patterned graphene layer 120, as shown in FIG. 4. Hereafter, the size of the aperture 122 is the diameter of the hole or width of the rectangular. The sizes of the apertures 122 can be different. The average size of the apertures 122 can be in a range from about 10 nanometers to about 500 micrometers. For example, the sizes of the apertures 122 can be about 50 nanometers, 100 nanometers, 500 nanometers, 1 micrometer, 10 micrometers, 80 micrometers, or 120 micrometers. The smaller the sizes of the apertures 122, the less dislocation defects will occur during the process of growing the first epitaxial layer 110. In one embodiment, the sizes of the apertures 122 are in a range from about 10 nanometers to about 10 micrometers. A duty factor of the graphene layer 120 is an area ratio between the sheltered epitaxial growth surface 101 and the exposed epitaxial growth surface 101. The duty factor of the graphene layer 120 can be in a range from about 1:100 to about 100:1. For example, the duty factor of the graphene layer 120 can be about 1:10, 1:2, 1:4, 4:1, 2:1, or 10:1. In one embodiment, the duty factor of the graphene layer 120 is in a range from about 1:4 to about 4:1.

Figure 5:
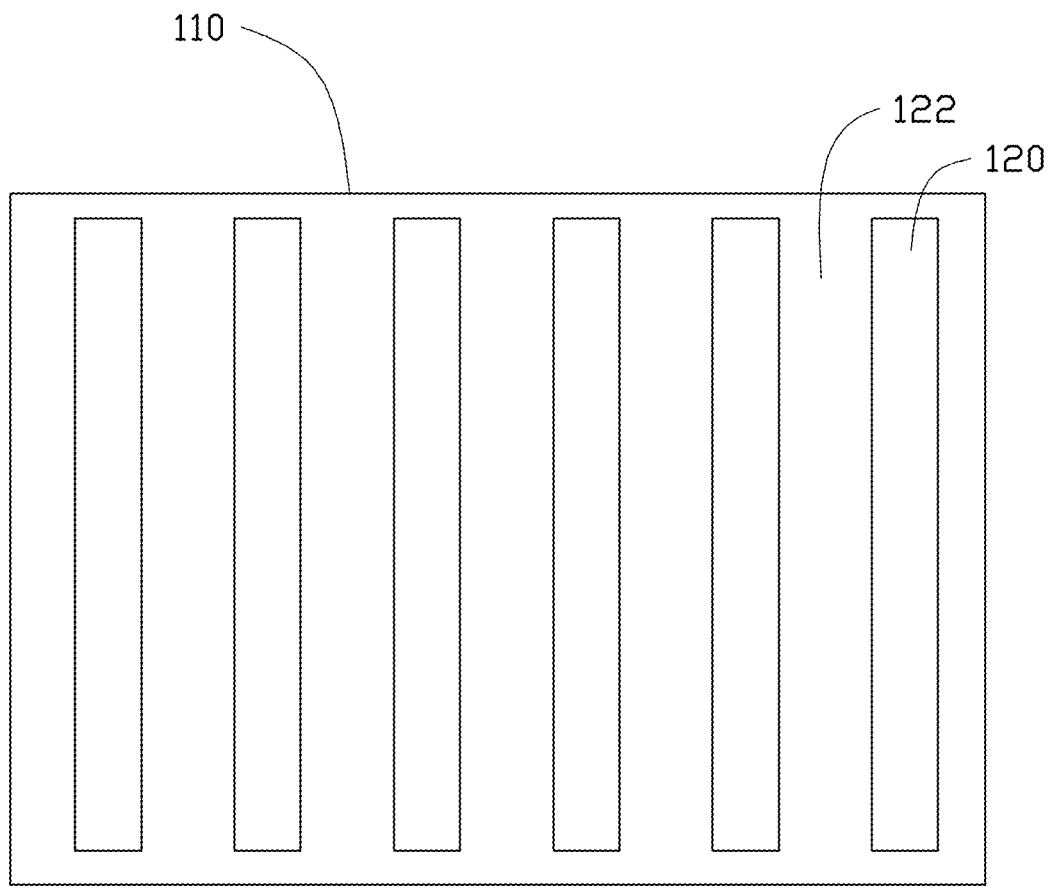
FIG. 5 is a schematic view of one embodiment of a plurality of sub graphene layers spaced from each other.

As shown in FIG. 5, the term "patterned structure" can also be a plurality of patterned graphene layers spaced from each other. The aperture 122 is defined between adjacent two of the patterned graphene layers. When the graphene layer 120 is located on the epitaxial growth surface 101, part of the epitaxial growth surface 101 is exposed from the aperture 122 to grow the first epitaxial layer 110. In one embodiment, the graphene layer 120 includes a plurality of graphene strips placed in parallel with each other and spaced from each other as shown in FIG. 5.

The graphene layer 120 can be located on the epitaxial growth surface 101 by transfer printing a preformed graphene film. The graphene film can be made by chemical vapor deposition, exfoliating graphite, electrostatic deposition, pyrolysis of silicon carbide, epitaxial growth on silicon carbide, or epitaxial growth on metal substrates.

In one embodiment, the graphene layer 120 can be made by following steps:
- step (131), making a graphene suspension with graphene powder dispersed therein;
- step (132), forming a continuous graphene coating on the epitaxial growth surface 101 of the substrate 100; and
- step (133), creating patterns on the continuous graphene coating.

In step (131), the powder is dispersed in a solvent such as water, ethanol, N-methyl pyrrolidone, tetrahydrofuran, or 2-nitrogen dimethylacetamide. The graphene powder can be made by graphite oxide reduction, pyrolysis of sodium ethoxide, cutting carbon nanotube, carbon dioxide reduction method, or sonicating graphite. The concentration of the suspension can be in a range from about 1 mg/ml to about 3 mg/ml.

In step (132), the suspension can be coated on the pitaxial growth surface 101 of the substrate 100 by spinning coating. The rotating speed of spinning coating can be in a range from about 3000 r/min to about 5000 r/min. The time for spinning coating can be in a range from about 1 minute to about 2 minutes.

In step (133), the method of creating patterns on the continuous graphene coating can be photocatalytic titanium oxide cutting, ion beam etching, atomic force microscope etching, or the plasma etching.

In one embodiment, photocatalytic titanium oxide cutting is used to pattern the continuous graphene coating. The method includes following steps:
  step (1331), making a patterned metal titanium layer;
  step (1332), heating and oxidizing the patterned metal titanium layer to obtain a patterned titanium dioxide layer;
  step (1333), contacting the patterned titanium dioxide layer with the continuous graphene coating;
  step (1334), irradiating the patterned titanium dioxide layer with ultraviolet light; and
  step (1335), removing the patterned titanium dioxide layer.

In step (1331), the method of creating patterns on the graphene film can be photocatalytic titanium oxide cutting, ion beam etching, atomic force microscope etching, or the plasma etching. In one embodiment, an anodic aluminum oxide mask is placed on the surface of the graphene film, and then the graphene film is etched by plasma. The anodic aluminum oxide mask has a plurality of micropores arranged in an array. The part of the graphene film corresponding to the micropores of the anodic aluminum oxide mask will be removed by the plasma etching, thereby obtaining a graphene layer 120 having a plurality of apertures.

In one embodiment, photocatalytic titanium oxide cutting is used to pattern the continuous graphene coating. The method includes following steps:
  (a) making a patterned metal titanium layer;
  (b) heating and oxidizing the patterned metal titanium layer to obtain a patterned titanium dioxide layer;
  (c) contacting the patterned titanium dioxide layer with the continuous graphene coating;
  (d) irradiating the patterned titanium dioxide layer with ultraviolet light; and
  (e) removing the patterned titanium dioxide layer.

In step (a), the patterned metal titanium layer can be formed by vapor deposition through a mask or photolithography on a surface of a quartz substrate. The thickness of the quartz substrate can be in a range from about 300 micrometers to about 1000 micrometers. The thickness of the metal titanium layer can be in a range from about 3 nanometers to about 10 nanometers. In one embodiment, the quartz substrate has a thickness of 500 micrometers, and the metal titanium layer has a thickness of 4 nanometers. The patterned metal titanium layer is a continuous titanium layer having a plurality of spaced stripe-shaped openings.

In step (b), the patterned metal titanium layer is heated under conditions of about 500° C. to about 600° C. for about 1 hour to about 2 hours. The heating can be performed on a furnace.

In step (d), the ultraviolet light has a wavelength of about 200 nanometers to about 500 nanometers. The patterned titanium dioxide layer is irradiated by the ultraviolet light in air or oxygen atmosphere with humidity of about 40% to about 75%. The irradiating time is about 30 minutes to about 90 minutes. Because the titanium dioxide is a semiconductor material with photocatalytic property, the titanium dioxide can produce electrons and holes under ultraviolet light irradiation. The electrons will be captured by the Ti (IV) of the titanium surface, and the holes will be captured by the lattice oxygen. Thus, the titanium dioxide has strong oxidation-reduction ability. The captured electrons and holes are easy to oxidize and reduce the water vapor in the air to produce active substance such as $O_2$ and $H_2O_2$. The active substance can decompose the graphene material easily.

In step (e), the patterned titanium dioxide layer can be removed by removing the quartz substrate. After removing the patterned titanium dioxide layer, the patterned graphene layer 120 can be obtained. The pattern of the patterned graphene layer 120 and the pattern of the patterned titanium dioxide layer are mutual engaged with each other. Namely, the part of the continuous graphene coating corresponding to the patterned titanium dioxide layer will be removed off.

In other embodiment, in step (a), the patterned metal titanium layer can be formed by depositing titanium on a patterned carbon nanotube structure directly. The carbon nanotube structure can be a carbon nanotube film or a plurality of carbon nanotube wires. The plurality of carbon nanotube wires can be crossed or weaved together to form a carbon nanotube structure. The plurality of carbon nanotube wires can also be located in parallel and spaced from each other to form a carbon nanotube structure. Because a plurality of apertures is formed in the carbon nanotube film or between the carbon nanotube wires, the carbon nanotube structure can be patterned. The titanium deposited on the patterned carbon nanotube structure can form a patterned titanium layer. In step (b), the patterned titanium layer can be heated by applying an electric current through the patterned carbon nanotube structure. In step (d), the part of the continuous graphene coating corresponding to the patterned carbon nanotube structure will be removed off to form a plurality of apertures 122. Because the diameter of the carbon nanotube is about 0.5 nanometers to about 50 nanometers, the size of the apertures 122 can be several nanometers to tens nanometers. The size of the apertures 122 can be controlled by selecting the diameter of the carbon nanotube.

The carbon nanotube structure is a free-standing structure. The term "free-standing structure" means that the carbon nanotube structure can sustain the weight of itself when it is hoisted by a portion thereof without any significant damage to its structural integrity. That is, the carbon nanotube structure can be suspended by two spaced supports. Thus, the process of creating patterns on the continuous graphene coating can be operated as follow. For example, first depositing titanium layer on a plurality of parallel carbon nanotube wires; second heating and oxidizing the titanium layer on the plurality of carbon nanotube wires form titanium dioxide layer; third locating the plurality of carbon nanotube wires on the continuous graphene coating; fourth irradiating the plurality of carbon nanotube wires with the ultraviolet light; last removing the plurality of carbon nanotube wires to obtain a graphene layer 120 having a plurality of rectangular shaped apertures 122.

Figure 6:
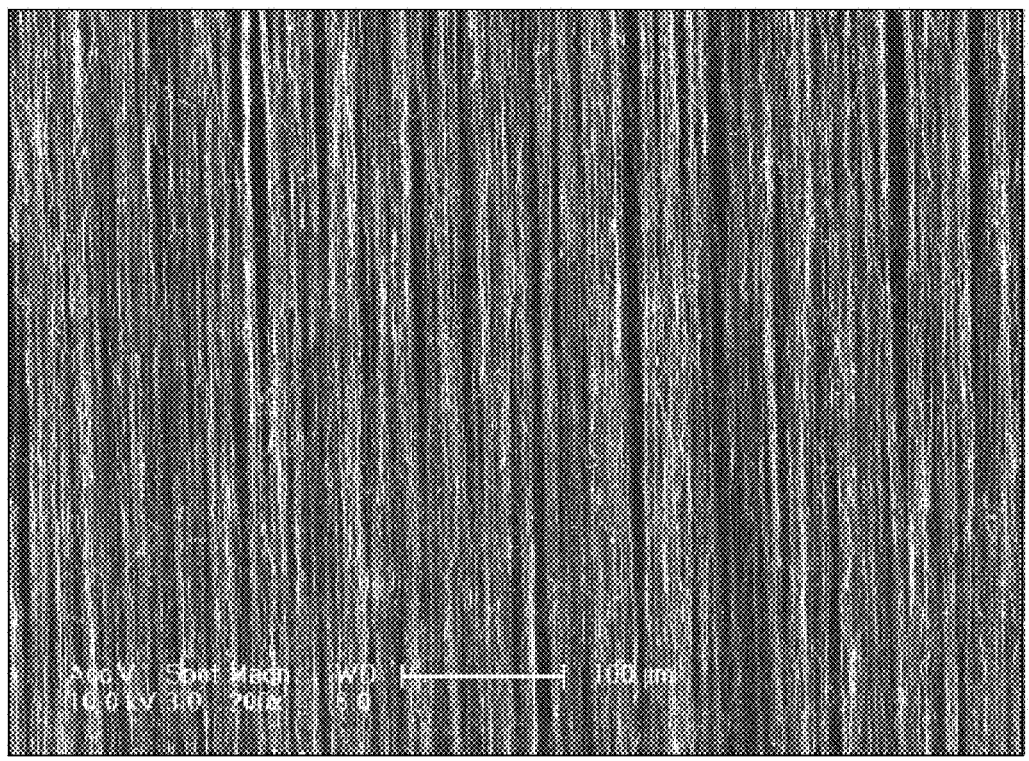
FIG. 6 is a scanning electron microscope (SEM) image of a drawn carbon nanotube film.
Figure 7:
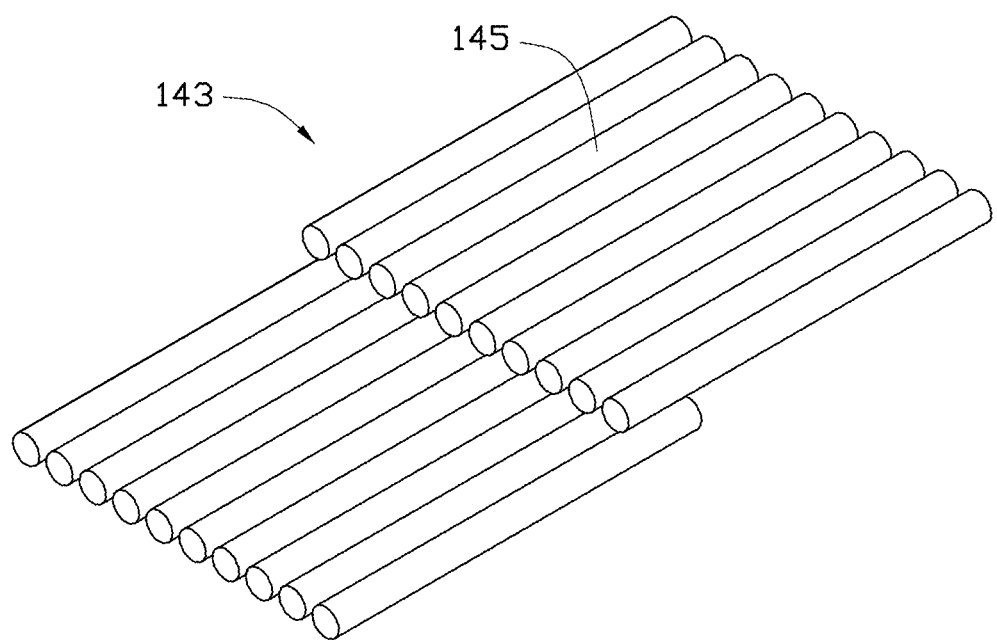
FIG. 7 is a schematic structural view of a carbon nanotube segment of the drawn carbon nanotube film of FIG. 6.
Figure 8:
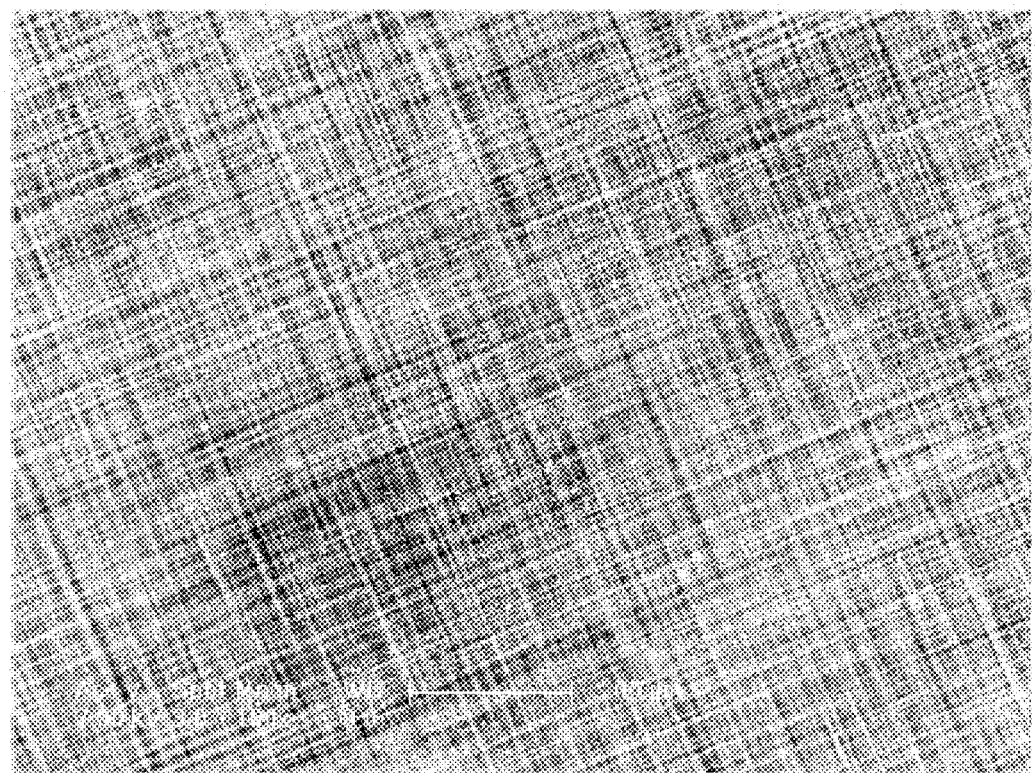
FIG. 8 is an SEM image of cross-stacked drawn carbon nanotube films.
Figure 9:
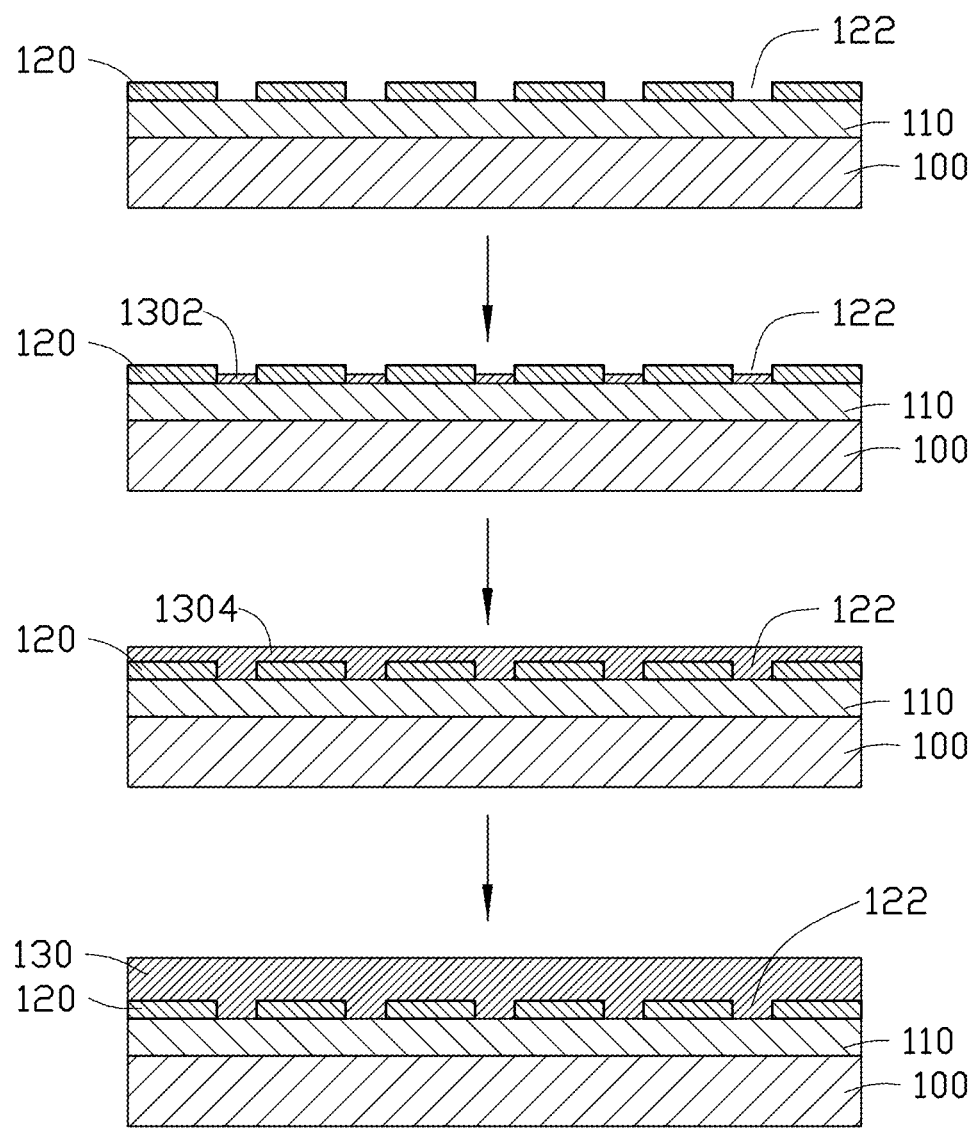
FIG. 9 is a process of growing a second epitaxial layer.

In one embodiment, the carbon nanotube structure includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 6-7, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. As can be seen in FIG. 8, some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film can be attached to the epitaxial growth surface 101 directly.

Figure 10:
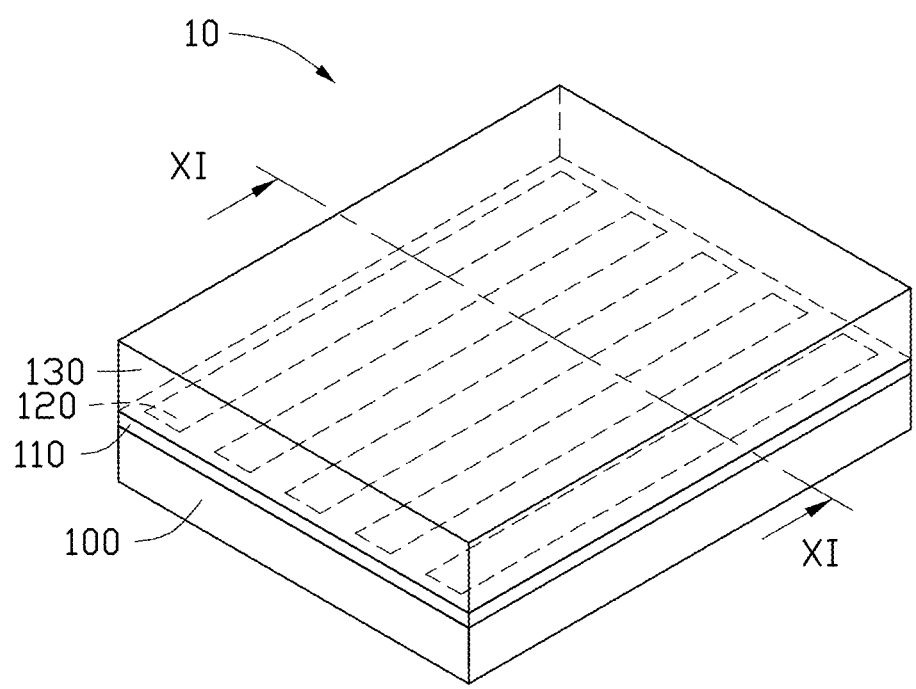
FIG. 10 is a schematic view of one embodiment of an epitaxial structure fabricated using the method of FIG. 1.

The carbon nanotube structure can include at least two stacked drawn carbon nanotube films. In other embodiments, the carbon nanotube structure can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure. Referring to FIG. 10, the carbon nanotube structure is shown with the aligned directions of the carbon nanotubes between adjacent stacked drawn carbon nanotube films at 90 degrees. Stacking the carbon nanotube films will also add to the structural integrity of the carbon nanotube structure.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. The untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

The twisted carbon nanotube wire can be formed by twisting a drawn carbon nanotube film using a mechanical force to turn the two ends of the drawn carbon nanotube film in opposite directions. The twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The graphene layer 120 can also be composed of graphene and additives. The additives can be carbon nanotube, $Si_3N_4$, BN, SiC, or $SiO_2$. The additives can be added into the graphene via chemical vapor deposition, physical vapor deposition, or magnetron sputtering. Furthermore, the epitaxial growth surface 101 can also be divided into a wetting area and non-wetting area, and the graphene is directly coated on the epitaxial growth surface 101 to form the graphene layer 120.

The graphene layer 120 can be used as a mask for growing the second epitaxial layer 130. The mask is the patterned graphene layer 120 sheltering a part of the first epitaxial layer 110 and exposing another part of the first epitaxial layer 110. Thus, the second epitaxial layer 130 can grow from the exposed first epitaxial layer 110 The graphene layer 120 can form a patterned mask on the first epitaxial layer 110 because the patterned graphene layer 120 defines a plurality of apertures 122. Compared to lithography or etching, the method of forming a patterned graphene layer 120 as mask is simple, low in cost, and will not pollute the substrate 100.

In step (S14), the method for growing the second epitaxial layer 130 can be same as the method of growing the first epitaxial layer 110. The material of the second epitaxial layer 130 can be same as the material of the first epitaxial layer 110, and the second epitaxial layer 130 and the first epitaxial layer 110 can be integrated to form an integrated structure, and the graphene layer 120 is embedded into the integrated structure. The second epitaxial layer 130 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD). The thickness of second epitaxial layer 130 can range from about 0.5 nanometers to about 1 millimeter, such as 100 nanometers, 200 nanometers to about 200 micrometers, 500 nanometers, 100 micrometers, 200 micrometers, or 500 micrometers.

The growth of the second epitaxial layer 130 includes following stages:

First stage, a plurality of epitaxial crystal nucleus forms on the entire exposed surface of the first epitaxial layer 110, and the epitaxial crystal nucleus grows to a plurality of epitaxial crystal grains 1302 along the direction perpendicular the first epitaxial layer 110;

Second stage, the plurality of epitaxial crystal grains 1302 grows to a continuous epitaxial film 1304 along the direction parallel to the first epitaxial layer 110;

Third stage, the epitaxial film 1304 continuously grows along the direction perpendicular to the first epitaxial layer 110 to form the second epitaxial layer 130.

In the first stage, because the graphene layer 120 is located on the second epitaxial growth surface 1011 and defines a plurality of apertures 122, the epitaxial crystal grains 1302 are grown from the exposed first epitaxial layer 110 through the apertures 122. The process of epitaxial crystal grains 1302 which grow along the direction substantially perpendicular to the first epitaxial layer 110 is called vertical epitaxial growth. The epitaxial crystal grains 1302 grow from the apertures 122 of the graphene layer 120.

In the second stage, the epitaxial crystal grains 1302 can grow along the direction parallel to the first epitaxial layer 110. The epitaxial crystal grains 1302 are gradually joined together to form the epitaxial film 1304 to cover the graphene layer 120. During the growth process, the epitaxial crystal grains 1302 will grow around the graphene, and then a plurality of holes will be formed in the second epitaxial layer 130 where the graphene existed.

In the third stage, the second epitaxial layer 130 covers the graphene layer 120, and contacts with the first epitaxial layer 110 through the apertures 122. Due to the graphene layer 120, the lattice dislocation between the epitaxial crystal grains and the first epitaxial layer 110 will be reduced during the growing process, thus the second epitaxial layer 130 has less defects therein.

Furthermore, a step of applying another graphene layer (not shown) on the epitaxial growth surface 101 before growing the first epitaxial layer 110 can be performed. Thus the quality of the first epitaxial layer 110 and the second epitaxial layer 130 can be improved.

Figure 11:
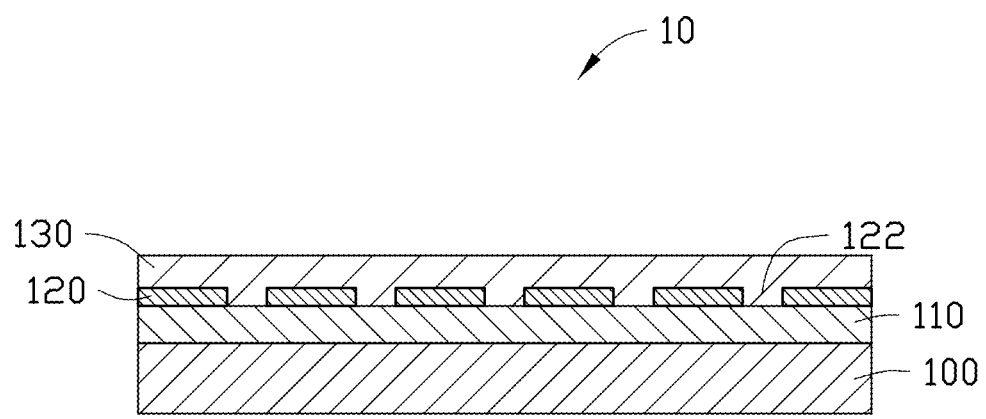
FIG. 11 is a schematic, cross-sectional view, along a line XI-XI of FIG. 10.

Referring to FIGS. 10 and 11, an epitaxial structure 10 provided in one embodiment includes a substrate 100 having an epitaxial growth surface 101, a first epitaxial layer 110, a graphene layer 120, and second epitaxial layer 130 stacked on the epitaxial growth surface 101 in that order. The graphene layer 120 is located on the epitaxial growth surface 101 and defines a plurality of apertures 122. A first part of the first epitaxial layer 110 is exposed through the plurality of apertures 122, and a second part of the first epitaxial layer 110 is covered by the graphene layer 120. The second epitaxial layer 130 is located on the graphene layer 120 and contacts the exposed surface of the first epitaxial layer 110 through the apertures 122.

The second epitaxial layer 130 defines a plurality of holes adjacent to and oriented to the first epitaxial layer 110. The holes can be blind holes or grooves. The holes and the first epitaxial layer 110 cooperatively form a sealed chamber to receive the graphene layer 120 therein. The inner wall of the holes can be in contact with the graphene layer 120. In one embodiment, the graphene layer 120 includes a plurality of graphene strips located in parallel with each other and spaced from each other.

Figure 12:
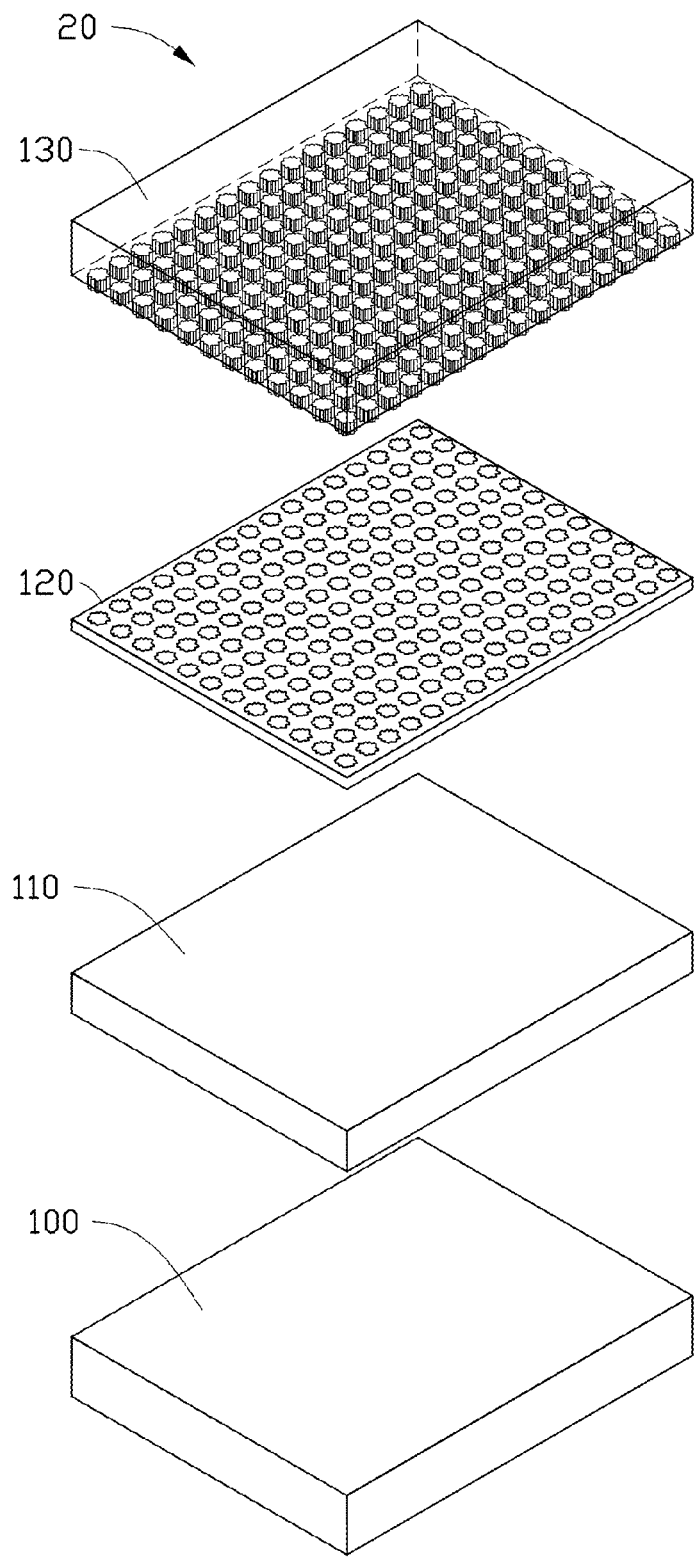
FIG. 12 is an exploded view of an epitaxial structure.
Figure 13:
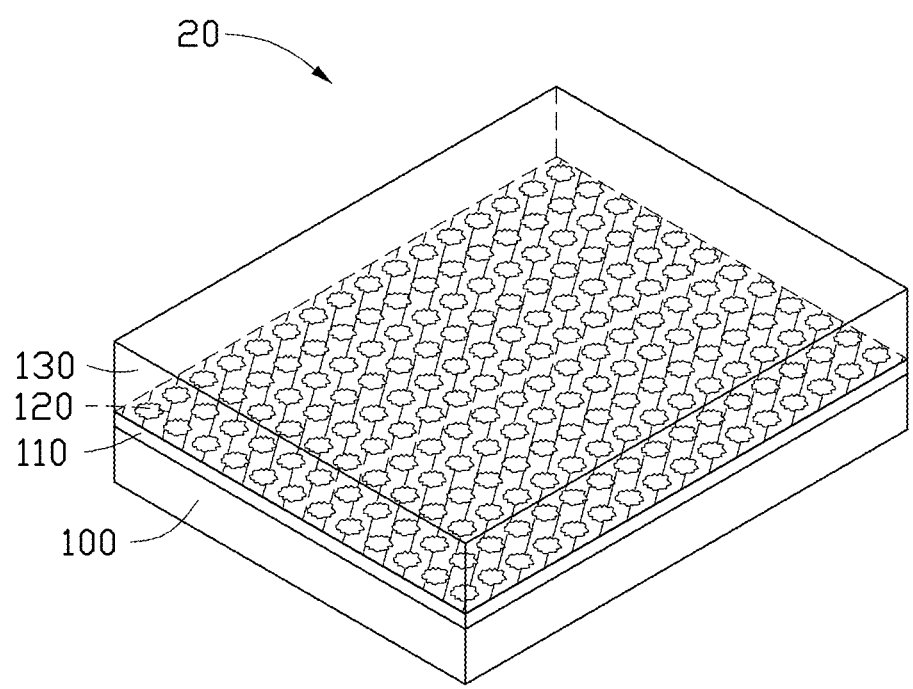
FIG. 13 is a schematic view of the epitaxial structure of FIG. 12.

Referring to FIGS. 12 and 13, an epitaxial structure 20 provided in one embodiment includes a substrate 100, a first epitaxial layer 110, a graphene layer 120, and second epitaxial layer 130 stacked on the substrate 100 in that order. The epitaxial structure 20 is similar to the epitaxial structure 10 above except that the graphene layer 120 is a graphene film having a plurality of circular shaped apertures 122 arranged in an array. Part of the second epitaxial layer 130 extends through the hole-shaped apertures 122 and in contact with the first epitaxial layer 110.

A method for making the epitaxial structure 20 of one embodiment is similar with the method for making the epitaxial structure 10, except that the graphene layer 120 is made of single graphene film. The method of making graphene layer 120 includes following steps:

(S141) providing a graphene film;
(S142) transferring the graphene film on the patterned epitaixal growth surface of the substrate 100; and
(S143) creating patterns on the graphene film.

In step (141), the graphene film is made by chemical vapor deposition which includes the steps of: (a1) providing a substrate; (b1) depositing a metal catalyst layer on the substrate; (c1) annealing the metal catalyst layer; and (d1) growing the graphene film in a carbon source gas.

In step (a1), the substrate can be a copper foil or a $Si/SiO_2$ wafer. The $Si/SiO_2$ wafer can have a Si layer with a thickness in a range from about 300 micrometers to about 1000 micrometers and a $SiO_2$ layer with a thickness in a range from about 100 nanometers to about 500 nanometers. In one embodiment, the $Si/SiO_2$ wafer has a Si layer with a thickness of about 600 micrometers and a $SiO_2$ layer with a thickness of about 300 nanometers.

In step (b1), the metal catalyst layer can be made of nickel, iron, or gold. The thickness of the metal catalyst layer can be in a range from about 100 nanometers to about 800 nanometers. The metal catalyst layer can be made by chemical vapor deposition, physical vapor deposition, such as magnetron sputtering or electron beam deposition. In one embodiment, a metal nickel layer of about 500 nanometers is deposited on the $SiO_2$ layer.

In step (c1), the annealing temperature can be in a range from about 900° C. to about 1000° C. The annealing can be performed in a mixed gas of argon gas and hydrogen gas. The flow rate of the argon gas is about 600 sccm, and the flow rate of the hydrogen gas is about 500 sccm. The annealing time is in a range from about 10 minutes to about 20 minutes.

In step (d1), the growth temperature is in a range from about 900° C. to about 1000° C. The carbon source gas is methane. The growth time is in a range from about 5 minutes to about 10 minutes.

In step (142), the transferring the graphene film includes the steps of: (a2) coating an organic colloid or polymer on the surface of the graphene film as a supporter; (b2) baking the organic colloid or polymer on the graphene film; (c2) immersing the baked graphene film with the $Si/SiO_2$ substrate in deionized water so that the metal catalyst layer and the $SiO_2$ layer was separated to obtain a supporter/graphene film/metal catalyst layer composite; (d2) removing the metal catalyst layer from the supporter/graphene film/metal catalyst layer composite to obtain a supporter/graphene film composite; (e2) placing the supporter/graphene film composite on the epitaxial growth surface 101; (f2) fixing the graphene film on the epitaxial growth surface 101 firmly by heating; and (g2) removing the supporter.

In step (a2), the supporter material is poly(methyl methacrylate) (PMMA), polydimethylsiloxane, positive photoresist 9912, or photoresist AZ5206.

In step (b2), the baking temperature is in a range from about 100° C. to about 185° C.

In step (c2), an ultrasonic treatment on the metal catalyst layer and the $SiO_2$ layer can be performed after being immersed in deionized water.

In step (d2), the metal catalyst layer is removed by chemical liquid corrosion. The chemical liquid can be nitric acid, hydrochloric acid, ferric chloride ($FeCl_3$), and ferric nitrate (Fe $(NO_3)_3$).

In step (g2), the supporter is removed by soaking the supporter in acetone and ethanol first, and then heating the supporter to about 400° C. in a protective gas.

In step (143), the method of creating patterns on the graphene film can be photocatalytic titanium oxide cutting, ion beam etching, atomic force microscope etching, or the plasma etching. In one embodiment, an anodic aluminum oxide mask is placed on the surface of the graphene film, and then the graphene film is etched by plasma. The anodic aluminum oxide mask has a plurality of micropores arranged in an array. The part of the graphene film corresponding to the micropores of the anodic aluminum oxide mask will be removed by the plasma etching, thereby obtaining a graphene layer 120 having a plurality of apertures 122.

Furthermore, another graphene layer (not shown) can be sandwiched between the substrate 100 and the first epitaxial layer 110 to improve the quality of the first epitaxial layer 110.

Figure 14:
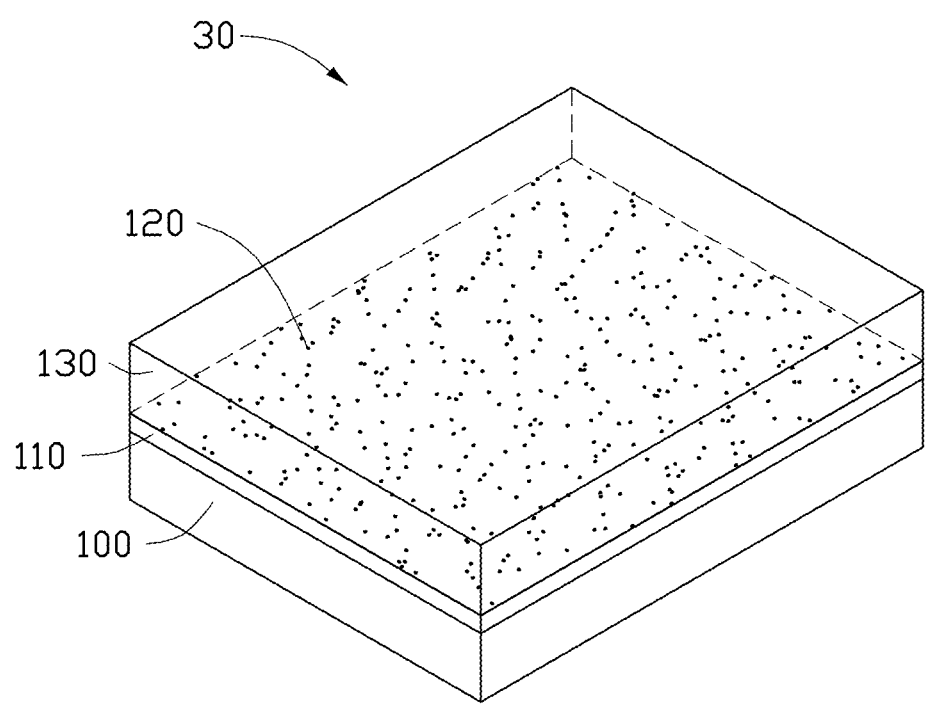
FIG. 14 is a schematic view of one embodiment of the epitaxial structure.

Referring to FIG. 14, an epitaxial structure 30 provided in one embodiment includes a first epitaxial layer 110, a graphene layer 120, and a second epitaxial layer 130 stacked on a substrate 100 in that order. The epitaxial structure 30 is similar to the epitaxial structure 10 above except that the graphene layer 120 is graphene powder dispersed on the epitaxial growth surface of the substrate 100. The graphene powder can be grown on the substrate 100 directly.

The epitaxial structure and method for growing the epitaxial layer on the epitaxial structure has following advantages. First, the substrate is a patterned structure having a plurality of grooves in micrometer scale, so the dislocation during the growth will be reduced. Second, the graphene layer is a patterned structure, the thickness and the aperture is in nanometer scale, thus the dislocation is further reduced and the quality of the epitaxial layer is improved. Third, due to the existence of the graphene layer, the contact surface between the epitaxial layer and the substrate will be reduced, and the stress between them is reduced, thus the substrate can be used to grow a relatively thicker epitaxial layer. Fourth, the graphene layer is a freestanding structure, thus it can be directly placed on the substrate, and the method is simple and low in cost. Fifth, the epitaxial layer grown on the substrate has relatively less dislocation, so it can be used to produce electronics in higher performance.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making an epitaxial structure, the method comprising:
   providing a substrate having an epitaxial growth surface;
   epitaxially growing a first epitaxial layer on the epitaxial growth surface;
   making a graphene layer on the first epitaxial layer, wherein the graphene layer is formed by:
      making a graphene suspension with graphene powders dispersed therein;
      forming a continuous graphene coating on the first epitaxial layer; and
      creating patterns on the continuous graphene coating; and
   epitaxially growing a second epitaxial layer on the first epitaxial layer.

2. The method of claim 1, wherein the graphene layer comprises graphene powders or a graphene film.

3. The method of claim 1, the step of making the graphene layer comprises forming a plurality of apertures in the graphene layer to expose a part of the first epitaxial layer.

4. The method of claim 3, wherein the step of growing of the second epitaxial layer comprise growing the second epitaxial layer from the exposed part of the first epitaxial layer and through the plurality of apertures.

5. The method of claim 3, wherein sizes of the plurality of apertures are in a range from about 10 nanometers to about 500 micrometers.

6. The method of claim 3, the step of making the graphene layer further comprises making the graphene layer having a dutyfactor in a range from about 1:4 to about 4:1, wherein the dutyfactor is an area ratio between a covered part to the exposed part of the epitaxial growth surface.

7. The method of claim 3, wherein the step of epitaxially growing the second epitaxial layer on the first epitaxial layer comprises:
   nucleating on the epitaxial growth surface and growing a plurality of epitaxial crystal grains along a direction substantially perpendicular to the first epitaxial layer;
   forming a continuous epitaxial film by growing the epitaxial crystal grains along a direction substantially parallel to the first epitaxial layer; and
   forming the second epitaxial layer by growing the continuous epitaxial film along the direction substantially perpendicular to the first epitaxial layer.

8. The method of claim 7, further comprising growing the plurality of epitaxial crystal grains to form a plurality of holes to enclose the graphene layer, and forming a patterned depression on a surface of the continuous epitaxial film adjacent to the first epitaxial layer.

9. The method of claim 1, the step of creating patterns on the continuous graphene coating comprising photocatalytic titanium oxide cutting, ion beam etching, atomic force microscope etching, or the plasma etching.

10. The method of claim 9, the step of creating patterns on the continuous graphene coating further comprising photocatalytic titanium oxide cutting, and the photocatalytic titanium oxide cutting comprises following steps:
   making a patterned titanium dioxide layer;
   contacting the patterned titanium dioxide layer with the continuous graphene coating;
   irradiating the patterned titanium dioxide layer with ultraviolet light; and
   removing the patterned titanium dioxide layer.

11. The method of claim 10, the step of making a patterned titanium dioxide layer comprises depositing titanium on a patterned carbon nanotube structure to obtain a patterned metal titanium layer and oxidizing the patterned metal titanium layer.

12. The method of claim 11, wherein the patterned carbon nanotube structure is a carbon nanotube film or a plurality of carbon nanotube wires.

\* \* \* \* \*